United States Patent [19]
Boettiger et al.

[11] Patent Number: 5,111,240
[45] Date of Patent: May 5, 1992

[54] METHOD FOR FORMING A PHOTORESIST PATTERN AND APPARATUS APPLICABLE THEREWITH

[75] Inventors: Ulrich C. Boettiger, Dettenhausen; Bernhard Hafner, Jettingen, both of Fed. Rep. of Germany

[73] Assignee: International Business Machines Corporation, Armonk, N.Y.

[21] Appl. No.: 477,371

[22] Filed: Feb. 8, 1990

Related U.S. Application Data

[62] Division of Ser. No. 292,086, Dec. 30, 1988, Pat. No. 4,935,334.

[30] Foreign Application Priority Data

Apr. 21, 1988 [EP] European Pat. Off. ........ 88106389.5

[51] Int. Cl.$^5$ .............................................. G03B 27/42
[52] U.S. Cl. ........................................ 355/53; 355/77
[58] Field of Search ...................... 355/52, 53; 430/322

[56] References Cited

U.S. PATENT DOCUMENTS

| | | | |
|---|---|---|---|
| 4,224,361 | 9/1980 | Romankiv | 427/259 |
| 4,298,273 | 11/1981 | Nishizuka et al. | 355/53 X |
| 4,308,337 | 12/1981 | Roach et al. | 430/296 |
| 4,545,673 | 10/1985 | Bergsma | 355/52 |
| 4,708,466 | 11/1987 | Isohata et al. | 355/53 |
| 4,716,443 | 12/1987 | Byers | 355/52 X |
| 4,748,477 | 5/1988 | Isohata et al. | 355/53 |

FOREIGN PATENT DOCUMENTS

| | | |
|---|---|---|
| 0227851 | 7/1987 | European Pat. Off. |
| 56-165325 | 12/1981 | Japan |
| 57-21819 | 2/1982 | Japan |

OTHER PUBLICATIONS

Abolafia, O. R., "Tapered Vias in a Photosensitive Dielectric Film", IBM Tech. Discl. Bull., vol. 21, No. 12 (May 1979), p. 4787.
Speidell, J. L., "Trench Elimination From Ion Etching", IBM Tech. Discl. Bull., vol. 23, No. 2 (Jul. 1980), pp. 826-827.
Quickle, R. J., "Spot Overlap in a Variably Shaped Spot Electron-Beam Exposure Tool", IBM Tech. Discl. Bull., vol. 24, No. 1A (Jun. 1981) pp. 79-81.
Ismail, K., "A Novel Method for Submicron Structurization Using Optical Projection Lithography", Microelectronic Engineering, vol. 1 (1983), pp. 295-230.
Badami, D. A., et al, "Photoresist Slope Control By Adjusting the Bandwidth and Wavelength of the Exposure Light", IBM Tech. Discl. Bull., vol. 26, No. 4 (Sep. 1983), pp. 1935-1936.
"Submikron-Lithografie fur V.L.S.I.", Neus Aus Der Technik, No. 2, No. 774 (Apr. 1984).
"A Process for Obtaining Positive Resist Slopes", Research Disclosure, No. 267, Abstract No. 26730, Emsworth, Hampshire, Great Britain (Jul. 1986), p. 399.

Primary Examiner—L. T. Hix
Assistant Examiner—D. Rutledge
Attorney, Agent, or Firm—William D. Sabo

[57] ABSTRACT

A method in which pattern elements with predetermined wall profiles and/or lateral shapes, differing from the shapes of the respective pattern elements in an irradiation mask which is used, are formed in a photoresist layer. The method comprises a modification of a conventional photolithographic process, where a substrate supporting the photoresist layer is shifted laterally relative to the mask or the mask image in a continuous mode or in steps during exposure. Also disclosed is an apparatus which shifts a substrate relative to a mask in the x- and/or the y-direction or shifts the path of the beam relative to the substrate, controlling the shifting in a predetermined manner. The method—especially in connection with the apparatus—allows formation of reproducible photoresist patterns with a great variety of differently formed wall profiles and/or lateral shapes. Using the method, photoresist patterns can be flexibly adapted to many applications.

6 Claims, 3 Drawing Sheets

METHOD FOR FORMING A PHOTORESIST PATTERN AND APPARATUS APPLICABLE THEREWITH

DESCRIPTION

1. Field of the Invention

This invention relates to a method for forming a pattern in a photoresist layer having openings with predetermined shapes and to an apparatus that can be applied in practicing such method.

2. Background of the Invention

Owing to the small structures (order of magnitude 1 μm) currently required in semiconductor technology, photoresist structures are generated usually by high-resolution projection exposure systems. The positive resists which are used for their favorable characteristics are highly transparent to the radiation ($\lambda = 435$ nm) generally employed for projection irradiation, i.e., the photoresist in the irradiated regions is disintegrated relatively uniformly across its entire thickness. After the irradiated photoresist layers have been developed, which—to effectively control this step—is performed with diluted basic developer solutions, the holes generated in the photoresist have vertical walls. When the photo resist patterns thus produced are used as etch masks in a subsequent dry etch step, the shape of the holes in the photoresist pattern is accurately transferred to the etched material, i.e., the holes in the etched material have vertical walls, as well. When, in still further process steps, a layer is vapor-deposited on the etched structure, problems arise because the thickness of the deposited layer is non-uniform and too thin, particularly in the region of the hole walls and the hole edges, which leads to poor step coverage and tearing. A typical example of such phenomena are metal lines with weak spots along the edges of contact holes in isolating layers. The described defects are responsible for an increased failure rate of components containing such structures.

Measures are known that are taken to prevent holes in vertical walls in etched structures. It is known, for example, to use multi-step etching, wherein by stepwise expansion of the etch mask, steps are etched into the hole walls (contour etching). In practice, this leads to inclined hole walls which prevent the above-described difficulties during the deposition of a layer. However, this known process is time-consuming and complicated, and thus expensive and not readily reproducible.

In another known process, the walls of the holes in the photoresist are inclined by heating the photoresist structure after development, which softens the photoresist, causing it to flow. As a result, the photoresist edges are rounded and the hole walls are inclined, meaning that the dimensions of the hole at the bottom, where it opens towards the material to be etched, are smaller than at the top. However, this process has the disadvantage that the edge angles of the walls depend on the hole diameter and the packing density in the vicinity of the hole. The inclination of the hole walls in the photoresist pattern is transferred to the holes resulting in the etched material. Although much simpler than the previously described known process, the latter process is not sufficiently accurate for forming holes with very small dimensions that must be reproducible within narrow tolerances.

DE-OS 2 645 081 describes a further process for producing photoresist patterns with inclined hole walls, in which
1. the UV-light used for irradiation defocuses or decollimates, and
2. a small spacing has to be kept between the mask and the photoresist layer, and/or
3. a thick (>2 μm) photoresist layer is used, and
4. a disperse (non-collimated) light source is employed.

This process, however, has the disadvantage that the transferred pattern is poorly defined and not readily reproducible.

In EP application 0 227 851, another process for forming a photoresist pattern having holes with inclined walls is described, wherein regions of a layer of a positive photoresist are image-irradiated in a projection exposure system and, additionally, at least the photoresist regions adjoining the image-irradiated layer regions are irradiated, using a radiation at which the photoresist is highly transparent, and wherein the irradiated regions are developed by means of a basic developer. The additional irradiation may cover the entire photoresist layer or may be limited to the regions adjoining the image-irradiated regions. This process avoids the disadvantages described above, however, in its preferred embodiment the thickness of the photoresist layer is substantially reduced, which can only be avoided by using an additional mask which makes the process more complicated and more expensive.

A further method for influencing the wall profile of openings in photoresist layers is described in the article, "A Novel Method for Submicron Structurization Using Optical Projection Lithography," by K. Ismail, v published in Microelectronic Engineering 1 (1983), page 295. In this method, called the "double exposure technique," the photoresist is exposed through a mask with the exposure time relatively short, such that the incident energy would not be high enough for developing the gate area. The mask is then shifted, for example, by using a micrometer screw, and exposed again for the same period where the shift is such that the two exposures overlap. The overlapping region is doubly exposed so that by developing the resist only this region is completely developed. The exposed opening has inclined walls. However, the angle range achievable of the wall inclination is restricted, especially when the ratio of the thickness of the resist layer to the dimension of the mask opening is large.

All the methods described above have in common that it is rather difficult, if not impossible, to shape the topography of the inclined walls in a predetermined manner. This option is very desirable. For example, if the photoresist pattern is used as a mask for doping a substrate by ion implantation, the doping profile in the substrate can be formed by shaping the wall profile in the photoresist pattern accordingly.

Sometimes it is of interest to tailor the openings in the photoresist layer with respect to their wall profile and/or with respect to their lateral shape, independently of the shape of the respective openings in the irradiation mask used. (In this context, lateral shape of an opening means the shape of the projection of the opening onto a surface aligned in parallel with the surface of the photoresist layer.) This applies especially to methods with which the reduction of the size of an opening in a mask can be achieved to a size below the resolution limit of the light used. The above cited article, published in Microelectronic Engineering, describes the formation of an opening in a photoresist layer which is narrower than the respective opening in the mask. However, the width of the opening is coupled to the inclination of its wall in the sense that with decreasing width, the inclination angle also decreases. Another method for achieving narrow openings in photoresist layers uses a bake cycle which causes the unexposed photoresist to flow into the developed opening whereby its size is reduced. However, this method is not sufficiently reproducible for application in VLSI technology.

SUMMARY OF THE INVENTION

It is, therefore, one object of the invention to provide a method for forming a photoresist pattern with openings having inclined walls where the inclination angle can be varied in a wide range independently of the photo resist thickness.

It is another object of the invention to provide a method for shaping the topography of the inclined walls in a predetermined way.

It is a further object of the invention to provide a method to form reproducibly predetermined wall angles and or predetermined wall topographies.

It is still another object of the invention to provide a method for forming a photoresist pattern with elements having lateral shapes differing from the shapes of the respective elements in the mask pattern as projected on the photoresist surface.

It is a still further object of the invention to provide a method which is applicable to a manufacturing environment.

It is also an object of the invention to provide an apparatus that can be applied for executing the above methods.

In accordance with the invention, there is provided a method of forming a photoresist pattern having openings with predetermined wall profiles, which involves shifting a substrate supporting the photoresist from a first position in which an irradiation mask and the substrate are aligned with each other laterally in a continuous mode or in at least two steps, relative to the irradiation mask or the mask projection during exposure, the substrate being displaced during at least part of the exposure.

In another aspect of the invention, there is provided a method of forming a photoresist pattern, which involves shifting a substrate supporting the photoresist from a first position in which an irradiation mask and the substrate are aligned with each other laterally in a continuous mode or in at least one step, relative to the irradiation mask or the mask projection during exposure, and displacing the substrate during at least part of the exposure, the shifting being performed in such a way that the lateral shape of the pattern elements is changed with respect to the respective mask pattern elements.

The invention also provides an apparatus for shifting laterally a substrate relative to a mask or the projection of the mask on the substrate surface relative to the substrate, which includes means for shifting the substrate into the x- and/or y-direction or means between the mask and the substrate for shifting the path of the beam relative to the substrate, and means for controlling the shifting means.

The shifting of the substrate relative to the mask or the mask projection includes the cases of shifting the mask with respect to the substrate and vice versa and shifting the mask projection with respect to the substrate. "Shifting in steps" in this context means a fast shift of short duration relative to the exposure time. It is also possible to switch off the light during the step.

Despite its simplicity, the method of the invention is capable of producing wall profiles of great variety and, if necessary, complexity without being dependent on or being influenced by the other parameters of the photolithographic process. Also, the application of the method of the invention is not dependent on a special mask pattern or on the thickness or the characteristics of the photoresist, i.e., the method is applicable to positive, as well as negative, photoresists and, also, in connection with the reversal process, using a positive resist to form a negative pattern.

The method of the invention allows formation of non-symmetric wall profiles. For example, when inclined walls are needed on only one side of the opening, by using the method of the invention, it is possible to form substantially vertical walls on the other sides of the opening. By this, remarkable savings of space can be achieved.

The method of the invention also allows modification of the shape of the pattern elements in the photoresist with respect to the respective mask pattern elements in a predetermined way. These changes can include an enlargement or a shrinkage of the pattern element in all or in one or several privileged directions, and also a complete new shaping of its contours. The walls of these openings in the photoresist pattern are essentially vertical, provided that the exposure dose reaching the exposed area is sufficient at least for full exposure everywhere in the whole area.

It is, however, possible to combine the tailoring of the wall inclination and/or the wall topography of the openings in the photoresist layer with the modification of their lateral shape with respect to the shape of the respective mask openings. In most applications, the modifications of the shape of the pattern elements is in no way coupled to the change of the wall profile or the wall topography. These modifications can include an enlargement or a shrinkage of the pattern element, and also a complete new shaping of its contours. This is one advantageous embodiment of the method of the invention. Another is a method where only a predetermined wall profile of the openings in the photoresist is formed, whereas their lateral shape remains unchanged with respect to the respective openings in the mask. The different results are achieved by controlling the shifts of the substrate relative to the mask in an appropriate and predetermined way and in adaptation to the thickness of the photoresist, its sensitivity at the wavelength of the light applied and the intensity of the exposure.

It is advantageous to use the method of the invention not only in connection with projection printing, but also in connection with the application of x-rays and e-beams. These applications are especially valuable, therefore, because, thus far, no other method is known for forming inclined walls by using x-ray or e-beam lithography.

The concept of achieving the relative shift in the inventive apparatus by shifting the substrate and having the mask in a fixed position is desirable, because this technique is highly developed for wafer steppers used for transferring mask patterns into photoresist layers and because this concept allows incorporation of the apparatus for shifting into such a wafer stepper. The shifting of the substrate into the x- and/or the y-direction can be accomplished by piezo translators or linear motors. In a preferred embodiment of the apparatus of the invention, the means used in wafer steppers to adjust the substrate relative to the mask can simultaneously be used for the shift in connection with the present invention. With the described means for shifting, accuracies of ±0.1 μm can be achieved. Means capable of shifting the path of the beam relative to the mask, like a plain parallel glass plate suspended in such a way that it can be tilted in a controlled manner, are known.

In a preferred embodiment of the apparatus of the invention, the shifting of the substrate or the movement of the means between the mask and the substrate are program controlled.

The foregoing and other objects, features and advantages of the invention will be apparent from the following more particular description of the preferred embodiments of the invention, as illustrated in the accompanying drawings.

FIG. 1 is a schematic cross-sectional detail representation of a projection mask with an opening and a photoresist layer with inclined walls formed using the method of the invention on a substrate, where—plotted against the exposure time—the respective lateral shifts of the substrate relative to the mask are indicated, FIG. 2A is a representation, as in FIG. 1, where the opening formed at the lower surface of the photoresist has a smaller dimension than the corresponding opening in the mask, FIG. 2B is a representation, as in FIG. 1, where the opening formed differs from the one shown in FIG. 2A by an additional enlargement of the dimension of the opening at the upper surface of the photoresist, FIG. 3 is a representation, as in FIG. 1, where the walls are shaped in a special way in order to use the pattern in the photoresist layer as ion implantation mask, FIG. 4 is a representation, as in FIG. 1, with the difference being that part of a dielectric layer underneath the photoresist layer is also shown, where the opening formed is used to form in the dielectric layer a via hole to a conductor which is very close to adjacent conductors, FIG. 5 is a schematic cross-sectional detail representation of a mask having two openings and a structured photoresist layer which includes a spacer having unsymmetrical sides with the dimension at the lower surface of the photoresist spacer being smaller than the respective dimension of the mask, FIG. 6 illustrates in a schematic representation the shifting of an x-y-table relative to a mask and optical means into the x-and/or y-direction where the table supports a substrate coated with a photoresist layer to be exposed according to the invention, and FIG. 7 is a schematic representation of one embodiment of the apparatus of the invention where the shifting into the x- and/or y-direction is program controlled.

DESCRIPTION OF THE PREFERRED EMBODIMENTS

The method of the invention is embodied in a conventional photolithographic process. In this process, a substrate is coated with a photoresist layer in a predetermined thickness usually by spin coating. This photoresist layer is—optionally after and/or prior to a baking cycle—patternwise irradiated where, when a negative photoresist or a positive resist in reverse mode is used, the irradiated resist becomes insoluble, and when a positive photoresist is used, the irradiated resist becomes soluble. In the context of this application, only irradiation through a mask having opaque and transparent regions is considered. The following description deals only with irradiation using UV-light where, when small structures (order of magnitude 1 μm) are to be generated, high-resolution projection exposure systems are used. (During projection exposure, the pattern in the projection mask is usually transferred to the photoresist layer, reduced by a factor of 5, which is not reflected in FIGS. 1 to 5.) It is, however, emphasized that the method of the invention is equally suitable for irradiation with x-rays and electrons, where the mask pattern is transferred to the photoresist layer in the ratio of 1:1. If UV-light is used, the natural resolution limit is on the order of 0,5 to 1 μm. It is also important to mention that the radiation is diffracted along the edges of the mask pattern, which influences to a certain degree the region exposed to the UV-light. The latent image produced in the photoresist layer by the irradiation is developed using a developer appropriate for the photoresist where the photoresist layer is structured in dependency to the transferred pattern. In the description which follows, the invention is described with reference to FIGS. 1 to 7.

The generated photoresist pattern can serve very different purposes. Among these, are application as an etching mask for the selective etching of the underlying material, application in a lift-off process which is an additive process for forming conductors, and application as an ion implantation mask for the selective doping of the underlying material.

It is the irradiation part of the photolithographic process with which the present invention is concerned.

Figure 1:
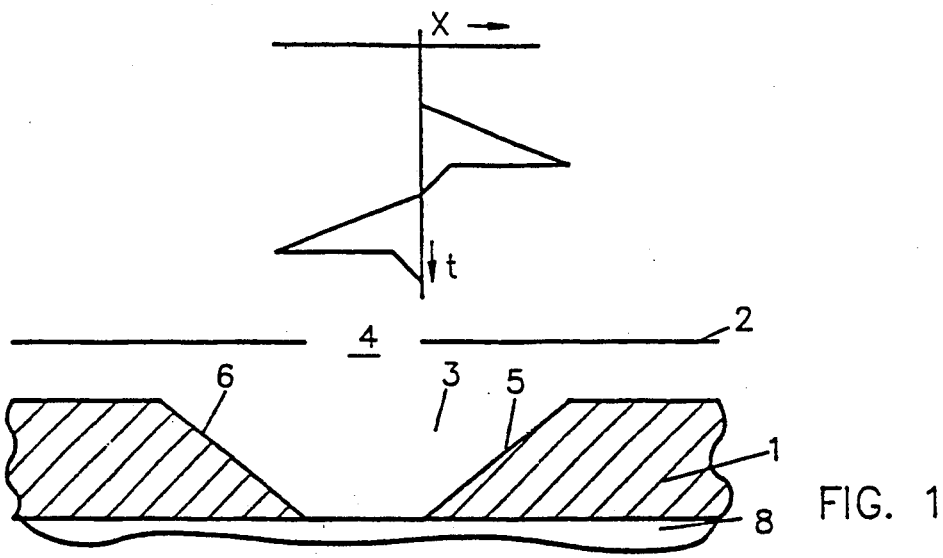

FIG. 1 shows in a schematic cross-sectional view a photoresist layer 1 overlying a substrate 8 and which has been irradiated through a mask 2 according to the method of the invention. For ease of illustration, mask 2 has only one opening 4, but it should be understood that in practice the mask has multiple openings of different shapes. Also, mask 2 does not have—as usual in projection photolithography—five times the size, but rather the same size as the pattern to be transferred into the photoresist layer 1. Photoresist layer 1 is shown after development of an opening 3 having inclined walls 5 and 6. To achieve the wall profiles of opening 3 as shown, the photoresist layer was shifted relative to the mask in the x-direction according to the diagram shown in which the amplitude of the shift is plotted against the exposure time. The exposure cycle is as follows: In the first section, the exposure takes place without shifting the substrate relative to the mask. This exposure time is long enough for the full development of the region of the photoresist layer underneath the mask opening. In the second section, the substrate is shifted into the x-direction, with the amplitude being larger than the dimension of the mask opening. Subsequently, the substrate is shifted back with the light switched off (switching off light is not necessary, if the time for shift back << exposure time) towards the original position, however, not completely, since in order to achieve the steady slope of wall 6, it is necessary to additionally irradiate the lower part of wall 6, slightly. This is because the amplitude of the shift in the second section was larger than the dimension of the mask opening 4, with the consequence that at the end of the shift into the +x-direction, the lower part of the wall 6 was shaded. Therefore, it is necessary to make in the next section of the irradiation a small shift (indicated in the diagram) into the -x-direction. When the substrate is again in its original position, the bottom part of the opening 3 and the wall 6 are irradiated. It remains now only to repeat the indicated shifts in a mirror-symmetrical way in order to irradiate the region of the wall 5. The inclined walls are achieved because the areas of the photoresist closer to the center of the opening are exposed for longer times than the areas at its periphery.

By varying the shift amplitude, the inclination angles of walls 5 and 6 can be made steeper or shallower. Naturally, it is also possible to generate differently inclined walls 5 and 6, including the case where wall 5 is inclined and wall 6 vertical. While for ease of illustration in FIG. 1, only shirts in the x-direction are contemplated, it is also possible to make a shift in the y-direction or simultaneously into the x- and y-directions, including shifts causing the walls all around to be inclined. It must be emphasized that the function x(t) can be different from the one indicated in FIG. 1 as long as the local dose to which the different areas or the photoresist surface are exposed remains the same. These statements apply to the description of the embodiments illustrated by FIGS. 2A to 5, as well.

Figure 2A:
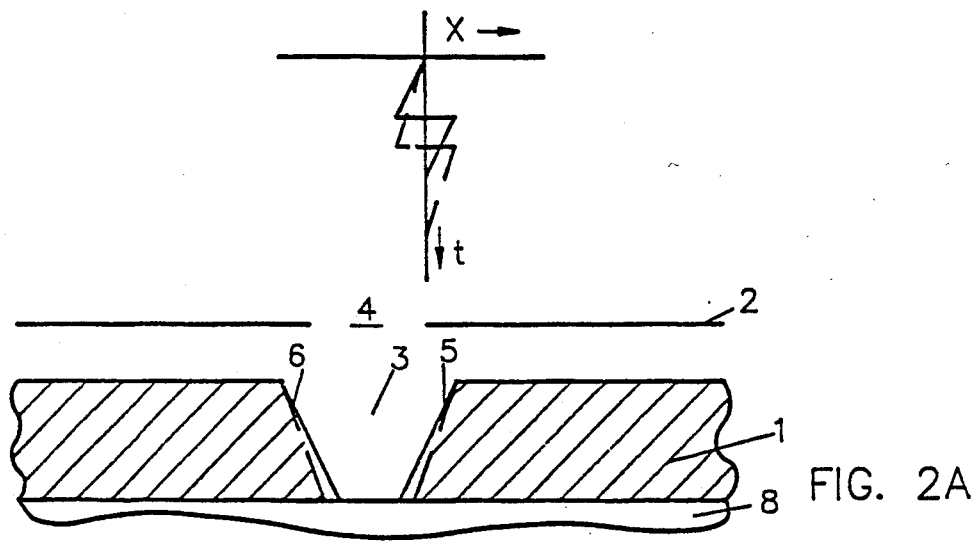

To produce the opening 3 shown in FIG. 2A, in principle, the same irradiation procedure has to be followed as described in connection with FIG. 1. Different only are the variation of the amplitude with the exposure time and the absolute value of the amplitude. The consequence is, that an opening is formed having a dimension at the lower surface of the photoresist—i.e. the surface adjacent substrate 8—which is smaller than the dimension of the opening 4 in the mask 2. Using this embodiment of the method of the invention, where it is intended to form an opening having a smaller dimension than the respective opening in the mask, one is not so free in the determination of the inclination angle because the inclination angle is coupled with the dimension of the opening at the lower surface and, to a lesser degree, with the dimension of the opening at the upper surface of the photoresist. The smallest dimension of the opening at the lower surface of the photoresist layer for a given shift is indicated in FIG. 2A by the wall profile, shown with solid lines. By increasing the exposure time, the dimension of the opening at the bottom surface of the photoresist layer is increased, and with it, the inclination angle. This is indicated in FIG. 2A by the wall profile and the curve in the diagram, shown with dotted lines.

Figure 2B:
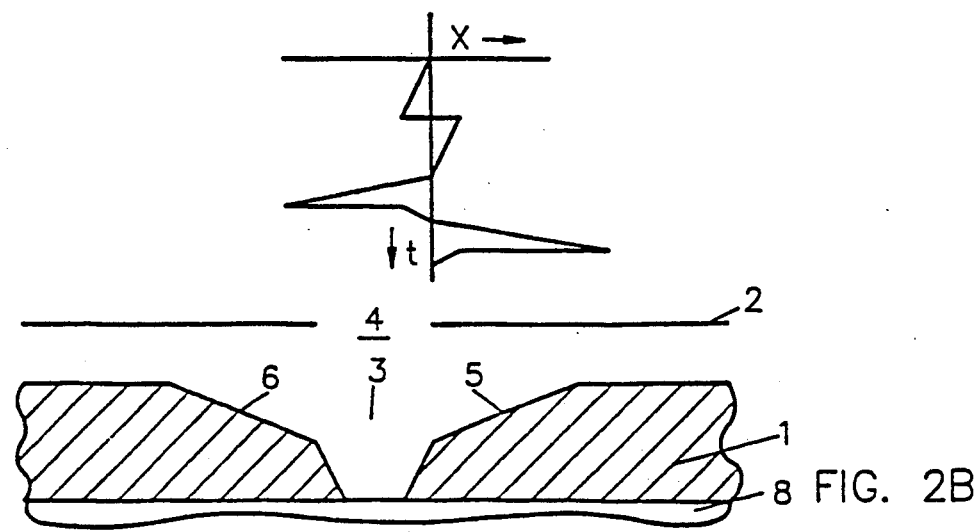

A cross-section of an opening as shown in FIG. 2B is generated by performing the same exposure cycle as applied for generating the opening shown in FIG. 2A, and by subsequently superimposing the exposure cycle as shown in FIG. 1, but with a shorter exposure time.

Figure 3:
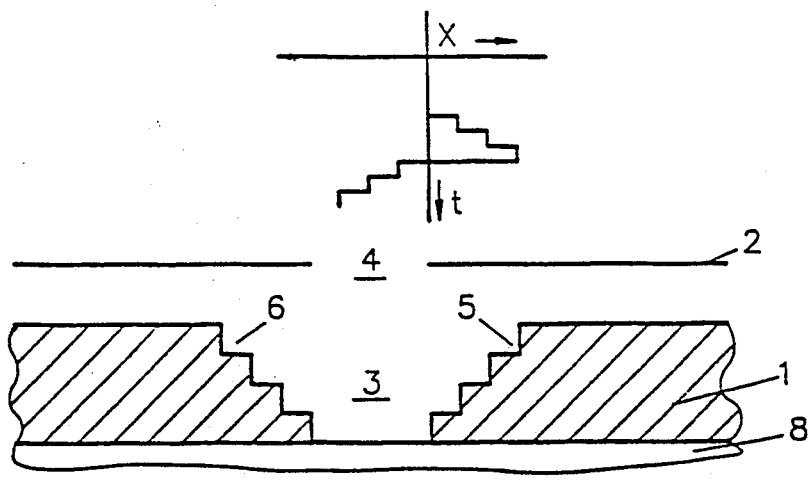

The wall profile shown in FIG. 3 is formed by applying the exposure cycle indicated in the respective diagram. Photoresist patterns of the kind displayed in FIG. 3, i.e. with a stepped topography, can, for example, be used as ion implantation masks for doping the underlying substrate in a predetermined way. Using the photoresist pattern shown in FIG. 3 as an implantation mask, the doping profile formed in the substrate will be equally stepped. The possibility of shaping doping zones reproducibly, not only laterally, but also vertically, in a predetermined way, becomes more and more important with the increasing density of integrated circuits.

Figure 4:
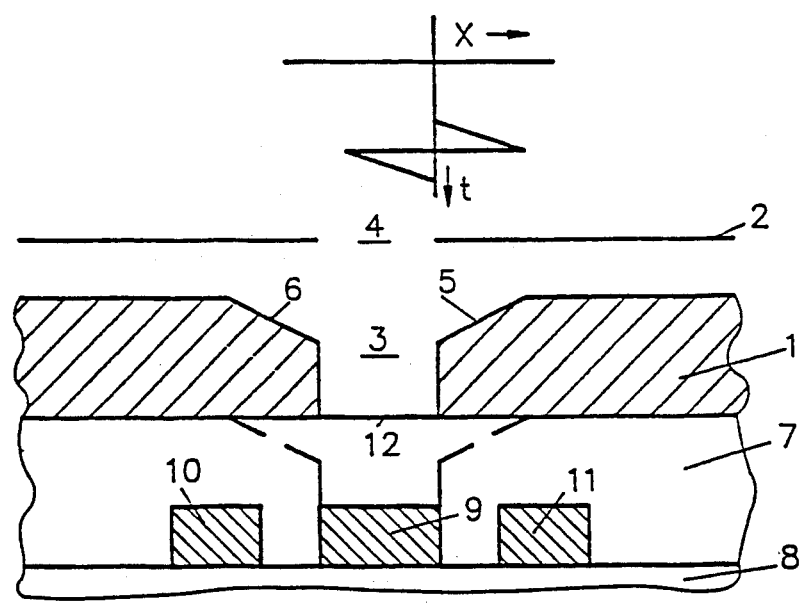

FIG. 4 shows in a cross-sectional view a structure comprising a photoresist layer 1 on a dielectric layer 7 overlying substrate 8. On substrate 8, three conductive lines are applied which are parallel and in close proximity to each other. In order to connect conductive line 9 to a second level metallization, a via hole 12 is to be etched into dielectric layer 7. The pattern formed in photoresist layer 1 by means of the present method serves as an etching mask for producing the via hole. The opening 3 in the photoresist layer 1 was formed by performing the exposure cycle indicated in the diagram. In the etch process, the via hole 12, having the same wall profile as the opening 3, will be formed in the dielectric layer 7. A via hole with such a wall profile serves two purposes. The inclined wall profile in the upper part of via hole 12 guarantees—as explained in detail at the beginning of this specification—a good step coverage at the edge of the via hole when metal is applied to it by evaporation. If the wall inclination would already start in the lower part of the via hole, the danger that a short circuit could occur between conductive lines 10 and 11 and the evaporated metal could not be excluded. By shaping the via hole, so that it shows the wall topography as represented in FIG. 4, a good step coverage is guaranteed and the danger of a short circuit is minimized, even when the density of the conductive lines is high.

Figure 5:
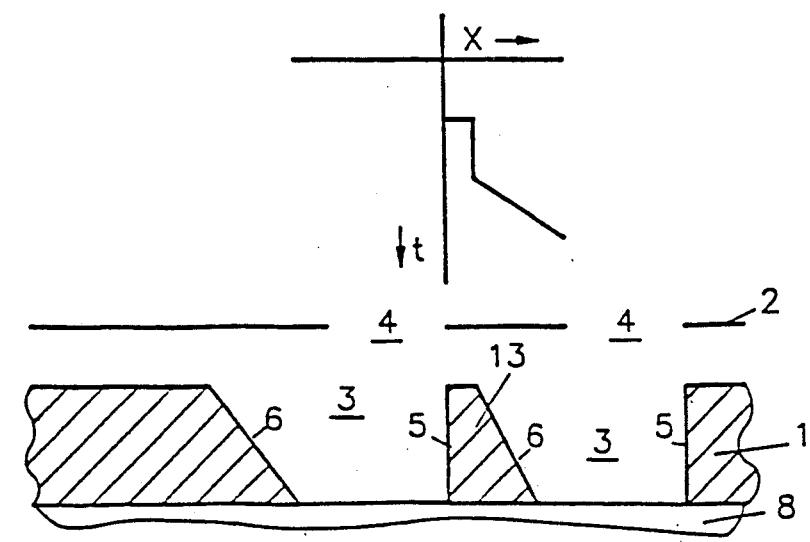

FIG. 5 illustrates the formation of a spacer 13 of photoresist on substrate 8. In the mask 2, two openings 4 are shown having a dimension of, for example, 1 μm and a distance about equal to such dimension (it is assumed that the mask pattern is not reduced upon exposure). In using the exposure cycles indicated in the respective diagram, the resulting two openings 3 have vertical walls 5, inclined walls 6 and a dimension of the opening at the lower surface of the photoresist layer that is larger than the dimension of the openings 4 in mask 2. Consequently, the spacer 13 has a vertical side and an inclined side, and the dimension of the spacer at the lower surface of the photoresist layer is—in the present example—clearly smaller than 1 μm, i.e., below the resolution limit. A spacer of this kind can be included in an implantation mask to form doped regions having an extremely small distance.

In addition to tailoring the wall profile and the dimensions of the pattern elements transferred into the photoresist layer, their shape can be changed by using the present method. For example, a mask element having a circular shape may be transformed into a straight or curved line in the photoresist layer by performing the appropriate shifts of the substrate. This variation of the method of the invention is valuable when, for example, a special conductive pattern is needed only once or in a few cases so that the generation of a suitable irradiation mask would be very uneconomical. The above description of various embodiments of the method of the invention shows its flexibility and effectiveness in forming very differently shaped photoresist patterns and its usefulness and adaptation capability for many applications.

Figure 6:
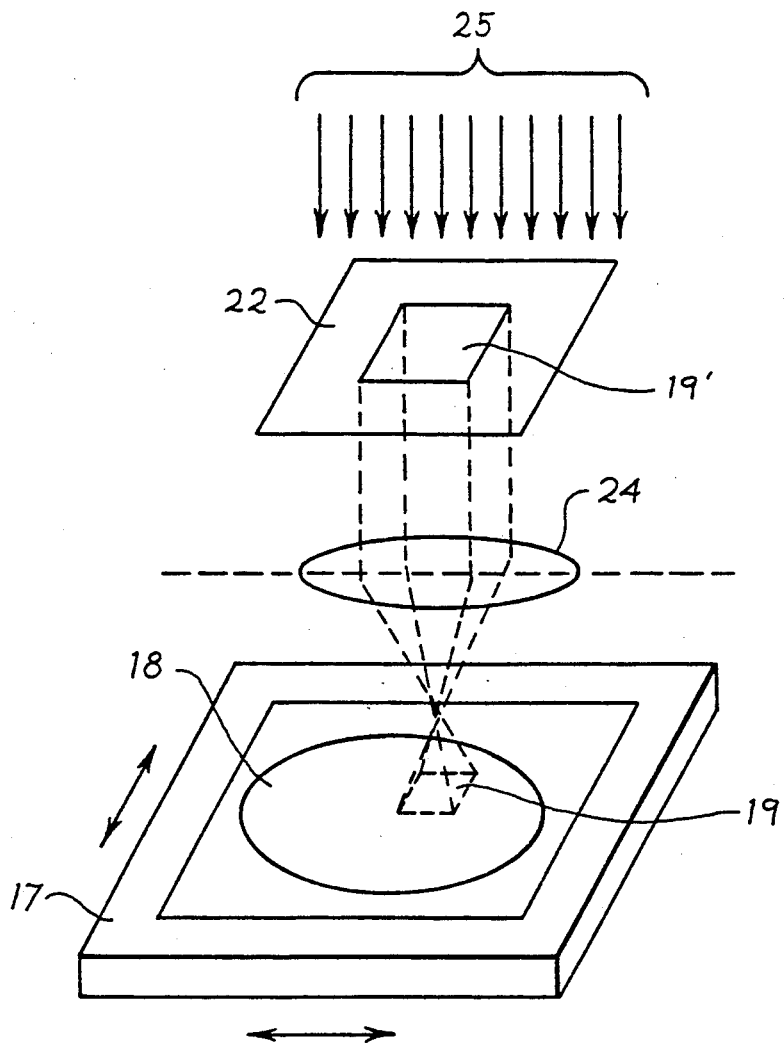

FIG. 6 is basically a schematic representation of a conventional wafer stepper used for repeatedly transferring a chip mask five times reduced on a wafer coated with a photoresist layer. Such a wafer stepper can—with modifications—advantageously be used for practicing the method of the invention. The wafer 18 onto which the chip pattern 19 is to be transferred is supported by an x-y-table 17 which is movable into the x- and the y directions with an accuracy of ±0.1 μm.

The UV-light 25 passes the mask 22 having five times the enlarged chip pattern 19' and the optical means 24 providing the image reduction, and impinges on wafer 18. The wafer stepper is operated in a step and repeat mode which means, that after each exposure the table 17 is moved (naturally this movement has to be extremely accurate) for a chip length, then the exposure is repeated and so on until the whole wafer surface is exposed to the irradiation. The means for moving table 17 can be used for shifting the photoresist layer relative to the mask as described in detail above. It is, however, also possible—if for any reasons individual means for shifting are more appropriate—to install such shifting means additionally in the wafer stepper. In another embodiment that might also be preferred—instead of shifting the table 17—means are brought into the path of the beam between the mask and the photoresist layer, such means being capable of shifting the beam laterally in a controlled manner.

Figure 7:
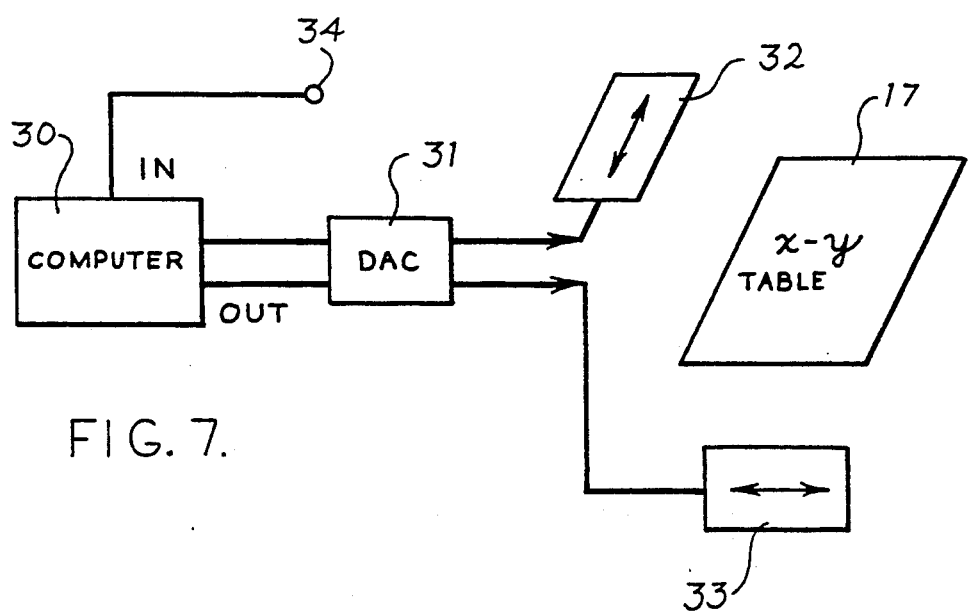

In practicing the method of the invention, the shift of the substrate or the beam has to be controlled in a predetermined way. FIG. 7 shows schematically one suitable arrangement to accomplish this for the case where the substrate is shifted. It is preferred—especially in a manufacturing environment—that the shift be computer controlled. In FIG. 7, numeral 30 indicates a computer, numeral 31 a digital analog converter (DAC), numerals 32 and 33 shifting means into the x- or y-direction, respectively, numeral 17 the x-y-table and numeral 34 the shutter for switching on and off the light. The software controlled instructions from the computer 30 are transformed in the DAC into machine readable form and then fed into shifting means 32 and 33. These perform the necessary shifts.

It depends on the chosen arrangement whether the modification necessary for the adaptation of the pattern generator to practicing the method of the invention is only software related, or whether the control means (computer and DAC) and the shifting means or only the latter have to be additionally installed.

In the following, the formation of an opening as shown in FIG. 1 is described in even greater detail.

Five samples were processed in the same way. The samples were photoresist coated silicon wafers. The photoresist employed was a positive photoresist marketed under the trade designation S1400-31 by Shipley. (This photoresist consists basically of a novolac resin and a diazonaphtoquinone sensitizer.) The thickness of the resist layer was about 2 $\mu$m. The samples were in each case heated prior to and after irradiation—prior to irradiation for 20 minutes to 85° C. and after irradiation for 10 minutes to 95° C. For the irradiation, the projection exposure system distributed by GCA under the name DSW6300 was used at a wave length of 436 nm and an energy of 110 mj/cm$^2$. The projection exposure system has a numeric aperture of 0.3 and the mask image is transferred to the photoresist layer five times reduced. The mask used for the irradiation had multiple square pattern elements with an edge length of 5 $\mu$m, i.e., if the pattern elements are transferred to the photoresist layer without practicing the present invention, the transferred pattern elements have an edge length of 1 $\mu$m. The resist coated wafers were brought into the projection exposure system, and the center of the wafer was positioned under the mask pattern. Subsequently, the wafer was exposed where, during part of the exposure, the wafer was shifted according to the diagram shown in FIG. 1. For the shifts, the x-and y-stage drivers of the projection exposure system were used. The modification of the exposure system provided for this experiment was exclusively software related. During the first section of the exposure cycle (this section took 1.3 seconds), the substrate was not shifted. In the second section that had the same duration, the substrate was shifted 1.25 $\mu$m; then the light was switched off and the substrate was shifted back until the shift, as compared with the original position, was 0.25 $\mu$m. Subsequently, the light was switched on again, and the substrate was shifted back into the original position within about 0.7 seconds. Subsequently, the shifts performed from the second section on were repeated, but in the opposite direction. The development of the irradiated and post-baked samples was effected at 25° C. using a 0.1 n KOH solution for 3 minutes in a tank.

From 10 openings of each of the five samples, the dimensions were measured. It was found that the dimension of the openings at the upper surface of the photoresist layer was 3.5 $\mu$m and the dimension of the openings at the lower surface was 1 $\mu$m. The reproducibility of these dimensions was ±60 nm (3 $\sigma$), which was mainly caused by the variations in the development process.

While the invention has been particularly shown and described with reference to preferred embodiments thereof, it will be understood by those skilled in the art that various changes in form and details may be made therein without departing from the spirit and scope of the invention.

What is claimed is:

1. An apparatus for shifting laterally a substrate relative to an irradiation mask or the projection of the mask on the substrate surface relative to the substrate, comprising means for shifting the substrate into the x- and/or the y-direction and relative to the mask or the projection of the mask on the substrate surface during exposure or means between the mask and the substrate for shifting the path of the beam relative to the substrate during exposure; means for controlling said shifting means during exposure; and means for adjusting the substrate relative to the mask, wherein said adjusting means are used for shifting and said controlling means are adapted to control and shifting in a predetermined manner during exposure:

2. The apparatus of claim 1, wherein said shifting during exposure is controlled by a computer program.

3. The apparatus of claim 2, wherein said controlling means comprises a computer operably connected to a digital analog converter, which is operably connected to said shifting means, and wherein software controlled instructions from said computer are transformed in said digital analog converter into machine readable form and then fed to said shifting means, so as to effect the desired shifting during exposure.

4. An apparatus for shifting laterally a substrate relative to an irradiation mask or the projection of the mask on the substrate surface relative to the substrate, comprising means for shifting the substrate into the x- and/or the y-direction and relative to the mask or the projection of the mask on the substrate surface during exposure or means between the mask and the substrate for shifting the path of the beam relative to the substrate during exposure, and means for controlling said shifting means during exposure, wherein said shifting is controlled by a computer program.

5. A wafer stepper for transferring a pattern from an irradiation mask to a wafer coated with a photoresist layer, aid stepper being operated in a step and repeat mode, said stepper comprising a table supporting said wafer, means for moving said table into the x- and/or the y- direction to shift said wafer relative to said mask during exposure, and means for controlling the movement of said table in a predetermined manner during exposure.

6. The wafer stepper of claim 5, wherein said controlling means comprises a computer operably connected to a digital analog converter, which is operably connected to said moving means, and wherein software controlled instructions from said computer are transformed in said digital analog converter into machine readable form and then fed to said moving means, so as to effect the desired shifting of said wafer during exposure.

* * * * *